(12) United States Patent
Kim et al.

(10) Patent No.: US 6,828,218 B2
(45) Date of Patent: Dec. 7, 2004

(54) METHOD OF FORMING A THIN FILM USING ATOMIC LAYER DEPOSITION

(75) Inventors: Yeong-Kwan Kim, Suwon (KR); Young-Wook Park, Suwon (KR); Seung-Hwan Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 173 days.

(21) Appl. No.: 09/872,203

(22) Filed: May 31, 2001

(65) Prior Publication Data

US 2003/0013320 A1 Jan. 16, 2003

(51) Int. Cl.[7] .......................... H01L 21/20; H01L 21/36
(52) U.S. Cl. .................. 438/478; 117/88; 117/102; 117/202; 438/479; 438/778; 438/781; 438/787; 438/791
(58) Field of Search ................. 438/478, 479, 438/778, 781, 787, 791, 654; 117/88, 89, 102, 202; 118/179

(56) References Cited

U.S. PATENT DOCUMENTS

| | | | |
|---|---|---|---|
| 4,058,430 A | 11/1977 | Suntola et al. | 427/255.13 |
| 5,112,641 A | 5/1992 | Harada et al. | 438/512 |
| 5,217,340 A | 6/1993 | Harada et al. | 414/172 |
| 6,015,590 A | 1/2000 | Suntola et al. | 427/255 |
| 6,042,652 A * | 3/2000 | Hyun et al. | 118/719 |
| 6,124,158 A | 9/2000 | Dautartas et al. | 438/21 |
| 6,511,539 B1 * | 1/2003 | Raaijmakers | 117/102 |
| 2001/0050039 A1 * | 12/2001 | Park | 117/102 |
| 2002/0004293 A1 * | 1/2002 | Soininen et al. | 438/584 |

FOREIGN PATENT DOCUMENTS

| | | |
|---|---|---|
| DE | 199 25 430 A1 | 12/1999 |
| DE | 198 53 598 A1 | 2/2000 |
| DE | 100 49 257 A1 | 4/2001 |
| EP | 1 069 599 A2 | 1/2001 |
| EP | 1 096 042 A1 | 5/2001 |
| WO | WO 01/29280 A1 | 4/2001 |

OTHER PUBLICATIONS

Kim, et al. Applied Physics Letters Dec. 22, 1997, pp. 3604–3606.
Ott et al. $Al_2O_3$ Thin Film Growth on Si (100) Using Binary Reaction Sequence Chemistry, (1997) 135–144.
Goto, et al. Atomic Layer Controlled Deposition of Silicon Nitride With Self–Limiting Mechanism.
English translation of DE 198 53 598 A1.
English translation of DE 100 49 257 A1.
English translation of DE 199 25 430 A1.

* cited by examiner

Primary Examiner—George Fourson
Assistant Examiner—Julio J. Maldonado
(74) Attorney, Agent, or Firm—Marger Johnson & McCollom, P.C.

(57) ABSTRACT

The present invention provides a method of forming a thin film using atomic layer deposition (ALD). An ALD reactor having a single reaction space is provided. A batch of substrates is concurrently loaded into the single reaction space of the ALD reactor.

Then, a gas containing reactants is introduced into the single reaction space, and a portion of the reactants is chemisorbed on top surfaces of the batch of substrates within the single reaction space. Non-chemically adsorbed reactants are then removed from the single reaction space.

In accordance with one embodiment of the present invention, after introducing the gas containing reactants, non-chemically adsorbed reactants are diluted in the single reaction space to facilitate the removal of non-chemically adsorbed reactants.

40 Claims, 6 Drawing Sheets

- 31, 35 : Dosing Step
- 32, 36 : Purging Step
- 33, 37 : Diluting Step
- 34, 38 : Removing Step

METHOD OF FORMING A THIN FILM USING ATOMIC LAYER DEPOSITION

BACKGROUND OF THE INVENTION

1. Field of the Invention

The present invention relates to the field of semiconductor devices and, more particularly, to a method of forming a thin film of a semiconductor device using atomic layer deposition (ALD).

2. Description of the Related Art

Forming thin films in state-of-the-art highly integrated semiconductor devices requires many rigorous manufacturing requirements such as a low thermal budget, excellent step coverage, accurate control of film thickness, simple process variables, and low particulate contamination.

Conventional CVD-based methods such as low-pressure chemical vapor deposition (LPCVD), plasma-enhanced chemical vapor deposition (PECVD) are no longer adequate for forming thin films in state-of-the-art devices, meeting the manufacturing requirements. For example, in a typical CVD method, a thin film is deposited at a relatively high temperature. This is undesirable because of the possibility of adverse thermal effects on the devices. Also, the CVD thin film often has drawbacks such as a non-uniform thickness, i.e., thickness variations across the surface of the device or particulate contamination.

As for LPCVD, the hydrogen content of a LPCVD thin film is usually high, and step coverage thereof is often unacceptable.

The atomic layer deposition (ALD) process has been proposed as an alternative to such conventional thin film formation technologies because the ALD process can be performed at lower temperatures than conventional CVD-based methods and also exhibits excellent step coverage.

One such ALD process technology is disclosed in U.S. Pat. No. 6,124,158. Here, a first reactant is introduced to react with the treated surface to form a bonded monolayer of reactive species. A second reactant is introduced to react with the surface to form a desired thin film. After each step in the cycle, the reaction chamber is purged with an inert gas to prevent reaction except on the surface. Typically, the supplying of the reactant and the purging are implemented under the same pressure due to reasons such as the maintenance of fabrication equipment.

However, such conventional ALD technologies also have several drawbacks such as low throughput due to problems such as a relatively low growth rate of atomic layers. Further, the reaction space of conventional ALD reactors such as a traveling wave-type reactor is designed to be very small to reduce the purging volume for purging of byproducts or the like. Thus, conventional ALD reactors only process one or two wafers in each operation, typically one substrate for one operation in a single reactor. Such drawbacks have made it difficult for many conventional ALD technologies to be put in practical applications and commercially acceptable, i.e., mass production.

Recently, several attempts have been made to increase the throughput of the ALD process. One such attempt is disclosed in U.S. Pat. No. 6,042,652. Here, the ALD reactor includes a plurality of modules and a plurality of reaction spaces (stages), i.e., spaces partitioned with the plurality of assembled modules. For example, a lower module is placed below an upper module, thereby creating one reaction space (one stage) between them, which is capable of receiving merely one semiconductor substrate.

However, because each reaction space (stage) is small and partitioned, i.e. being separated from each other, each substrate is inserted in one of the reaction spaces (stages) one by one. Thus, it is hard to utilize an automated wafer transfer mechanism for loading/unloading of the plurality of wafers. Consequently, it takes a significantly long time to load/unload wafers. Also, the number of wafers that can be loaded and processed is still not sufficient.

Accordingly, what is clearly needed is a novel ALD process enabling high throughput that can deal with above mentioned problems while still providing high-quality thin films.

SUMMARY OF THE INVENTION

The present invention provides a method of forming a thin film using atomic layer deposition (ALD). A reactor having a single reaction space is provided. A batch of substrates is concurrently loaded into the single reaction space of the reactor.

Then, a gas containing reactants is introduced into the single reaction space, and a portion of the reactants is chemisorbed on top surfaces of the batch of substrates or wafers within the single reaction space. Non-chemically adsorbed reactants are then removed from the single reaction space.

In accordance with one embodiment of the present invention, after introducing the gas containing reactants, non-chemically adsorbed reactants are diluted in the single reaction space to facilitate the removal of non-chemically adsorbed reactants.

Also, according to another embodiment of the present invention, a method of forming a thin film is disclosed in which a reactor having a single reaction space is provided. A plurality of wafers, each having a processing surface, is introduced into the reaction space. The processing surfaces of the plurality of wafers face in substantially the same direction. First reactants are introduced into the reaction space such that a portion of the first reactants is chemically adsorbed on the processing surfaces of the plurality of wafers for ALD. Then, a non-chemically adsorbed portion of the first reactants is removed from the reaction space. Next, second reactants are introduced into the reaction space. Also, a portion of the second reactants is chemically adsorbed on the processing surface of each of the plurality of wafers. Subsequently, a non-chemically adsorbed portion of the second reactant is removed from the reaction space.

The foregoing and other objects, features and advantages of the invention will become more readily apparent from the following detailed description of a preferred embodiment of the invention that proceeds with reference to the accompanying drawings.

DETAILED DESCRIPTION

The present invention in general contemplates a method of manufacturing a thin film by an ALD technology, through which throughput can be significantly increased compared with the conventional ALD technologies.

In the following description, numerous specific details are set forth to provide a through understanding of the present invention. However, one having ordinary skill in the art should recognize that the invention can be practiced without these specific details. In some instances, well-known process steps, and techniques have not been shown in detail to avoid obscuring the present invention.

Herein below, a method of forming a thin film using ALD in accordance with an embodiment of the present invention is described.

Figure 1:
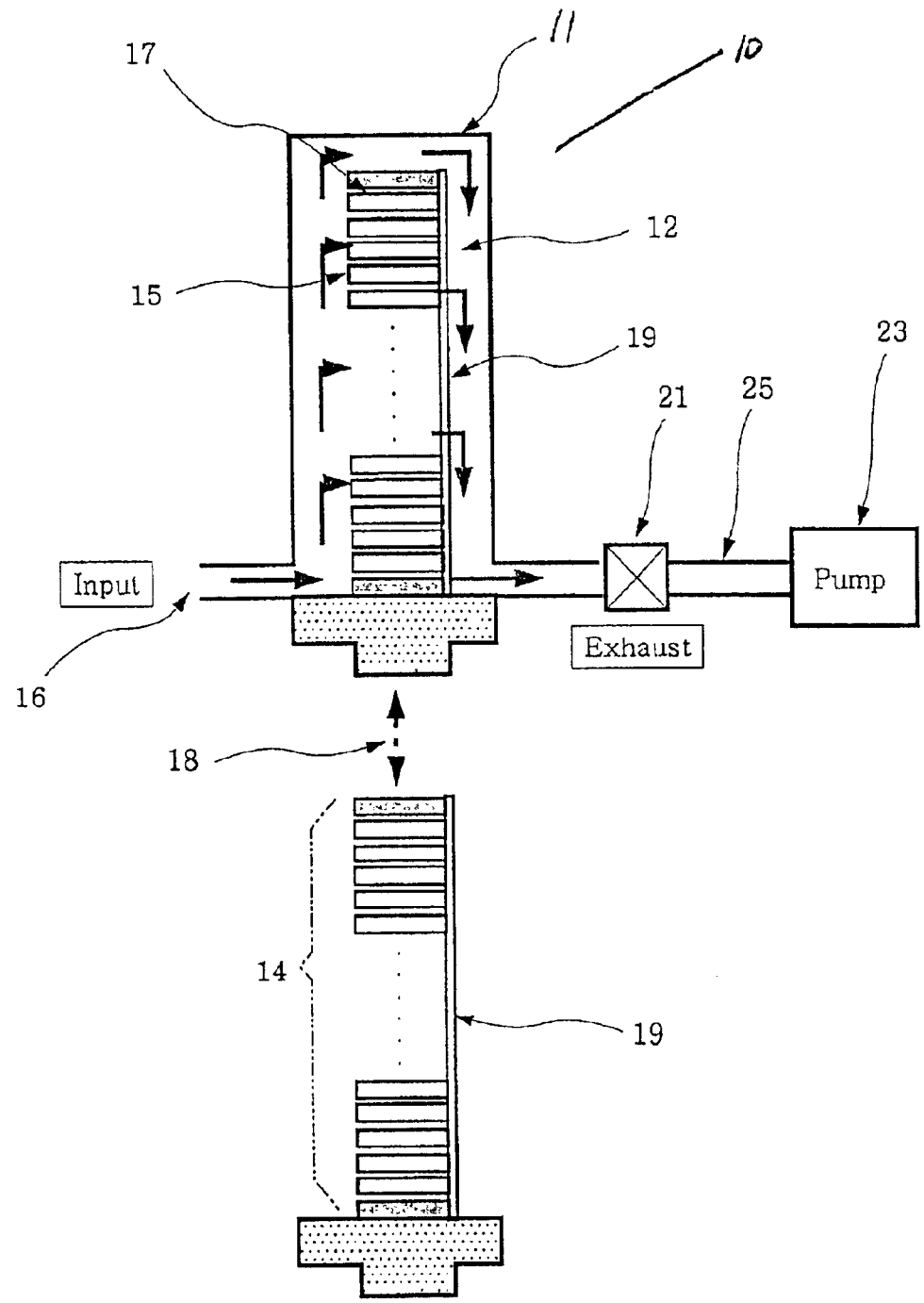
FIG. 1 is a schematic cross-sectional view of an ALD reactor in accordance with one embodiment of the present invention.

Referring to FIG. 1, there is schematically shown an ALD reactor 10 having a single reaction space 12 within a process tube 11. Other parts of the reactor 10 such as a heater are omitted for the sake of simplicity. Preferably, the ALD reactor 10 is a furnace-type vertical reactor (vertically oriented) that is similar to conventional LPCVD furnaces as shown in U.S. Pat. Nos. 5,217,340 and 5,112,641. However, any other type of reactor such as one being horizontally oriented, which is suitable for implementing the present invention, can be used instead within the spirit and scope of the present invention.

According to the present invention, the reaction space 12 can mean a space where substrates 15 (or wafers) are placed and where various process sequences of ALD occur. Also, in the present invention, the single reaction space 12 is not partitioned or separated. This is different from the reaction space of conventional reactors such as one shown in U.S. Pat. Nos. 6,042,552 and 6,015,590, where there are multiple (partitioned) reaction spaces in an ALD reactor. In these conventional ALD reactors, particularly, in U.S. Pat. No. 6,015,590, because each of the multiple (partitioned) reaction spaces has a very narrow cross section for minimizing the volume of the reaction space for purging efficiency, the number of the substrates that can be placed in each of the reaction space is very small, for example, one or two substrates for each reaction space. Also, this aspect of conventional ALD reactors limits the total number of substrates that can be placed in a reactor due to such structural limitations as described above. For example, the modules themselves shown in U.S. Pat. No. 6,042,652 which form each reaction space can take up a significant amount of space or volume within the reactor. These can severely reduce the throughput of the ALD process.

However, in the present invention, because the furnace-type ALD reactor 10 has a large-volume single reaction space 12 without being partitioned, the ALD reactor 10 can receive more than one hundred (100) substrates therein as illustrated in FIG. 1. Thus, the number of the substrates to be processed for one ALD operation can be significantly increased (significant increase of throughput).

To process the substrates 15 forming ALD thin films thereon, one batch 14 of substrates 15 is substantially concurrently loaded into the single reaction space 12 of the ALD reactor 10 as schematically illustrated in FIG. 1. In the present invention, the one batch 14 can mean the total number of substrates loaded into the reactor 10 for one ALD operation to form a thin film on the substrates 15. In accordance with one embodiment of the present invention, the one batch 14 preferably comprises approximately 125–135 substrates. Each of the substrates 15 has a processing surface 17 preferably on its top.

Preferably, in the present invention ALD process, during the load/unloading of the substrates 15, the batch 14 of substrates 15 is loaded to the ALD reactor 10 using an automatic (i.e., non-manual) wafer transport mechanism 18 as schematically illustrated in FIG. 1. Such automatic wafer transport mechanism 18 can be one disclosed in U.S. Pat. Nos. 5,217,340 and 5,112,641. However, any other type of automatic wafer transport mechanism that is suitable for implementing the present invention can be used instead within the spirit and scope of the present invention.

In other words, in the present invention, because all of the product substrates 15 for a single ALD operation can be placed in the single reaction space 12, not distributed among several reaction spaces in a reactor, the loading/unloading of a batch 14 of substrates 15 can be automatically and quickly done by the wafer transport mechanism 18. In particular, the batch 14 of substrates are arranged in a predetermined manner and inserted into a boat 19. The boat 19, typically formed of quartz or other conventional materials, has a plurality of grooves on its inner surface to receive each of substrates 15. And the boat 19 containing the batch 14 of substrate is loaded into the ALD reactor 10, thus concurrently loading the batch 14 of substrates 15 into the single reaction space 12 of the ALD reactor 10 in a manner schematically described in FIG. 1. Here, substantially all the top surfaces 17 (processing surfaces) of the substrates 15 face the same direction for automated wafer transfer.

This provides an important advantage, especially in terms of throughput, over conventional ALD techniques such as one disclosed in U.S. Pat. No. 6,015,590, where top surfaces of the wafers faces opposite direction, thus automatic wafer transfer is quite cumbersome or impossible. Thus, in the conventional ALD technologies, only a small number of substrates, mostly one, can be placed in each reaction space one after another. This is because the substrates need to be distributed among several reaction spaces in a reactor and the distribution is nearly impossible or difficult to be done all at once. This is also true for a conventional ALD technique disclosed in U.S. Pat. No. 6,042,652, where a plurality of circular semiconductor substrates are transferred one by one into the reaction spaces (stages) as described above in the background. This whole loading process takes a long period of time, significantly reducing the throughput and thus limiting the commercial application of the ALD process.

Figure 2:
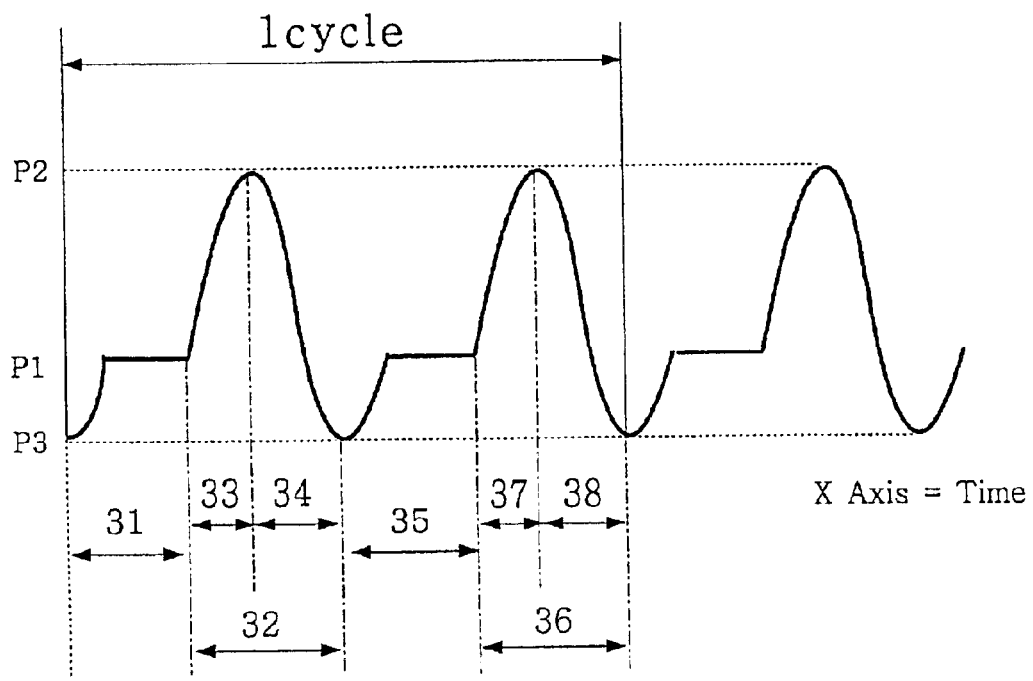
FIG. 2 is a graph illustrating the pressure of the ALD reactor in each step of ALD in accordance with one embodiment of the present invention.
Figure 3A:
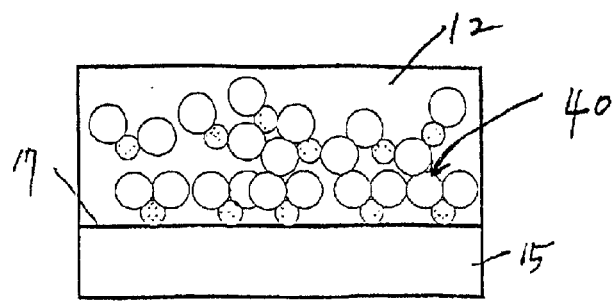
FIGS. 3A–3D illustrate the process steps for forming an ALD thin film according to one embodiment of the present invention.

As schematically illustrated in FIG. 3A, as in the manner of conventional ALD technologies, first reactants 40 or a gas containing first reactants is introduced (dosing step) through the input 16 of FIG. 1 such as gas supply lines (not shown) of the ALD reactor 10 into the single reaction space 12. Thus, a portion of the first reactants 40 is chemically adsorbed (chemisorbed) onto the processing surfaces 17 of the batch 14 of the substrates 15 within the single reaction space 12. As shown in FIG. 2, the dosing step 31 is preferably performed at a first predetermined pressure P1, between approximately 0.1 Torr and approximately 0.5 Torr.

On the other hand, in the present invention, to further increase the throughput of ALD, the purging time for ALD need to be reduced. This is because, in general, the purging time is dependent on the volume of a reactor. Because the present invention utilizes a furnace-type reactor having a large volume, the purging volume is substantially larger than other conventional ALD techniques such as the traveling wave type apparatus shown in U.S. Pat. Nos. 6,042,552 or 6,015,590.

To deal with this issue, according to one embodiment of the present invention, after introducing the first reactants 40, to effectively reduce the purging time, a non-chemically adsorbed portion of the first reactants 40 is diluted in the single reaction space 12 before removal of the non-chemically adsorbed portion of the first reactants 40 from the ALD reactor 10. Here, the non-chemically adsorbed portion of the first reactants 40 includes physically adsorbed (physisorbed) reactants, i.e. first reactants 40 physically attaches onto, and is loosely held to the chemisorbed portion of the first reactants 40 or any residual reactive material within the ALD reactor 10.

For the diluting step 33 of FIG. 2, the ALD reactor 10, as shown in FIG. 1, includes a pressure control valve 21 connected to an exhaustion line 25 or a roughing line for removing the diluted non-chemically adsorbed portion of the first reactants 40 from the ALD reactor 10. The exhaustion line 25 is connected to a pump 23 for discharging the non-chemically adsorbed portion of the first reactants 40 from the reactor 10 to the outside. During the diluting step 33, the control valve 21 is substantially closed and an inert gas is supplied through input 16 into the reactor 10, and the introduction of the first reactants 40 into the ALD reactor 10 is substantially stopped. That is, conductance of the exhaustion line 25 of the ALD reactor 10 is reduced.

Alternatively, during the diluting step 33, an inert gas with an amount substantially more than the amount of the first reactants 40 is introduced into the ALD reactor 10 while stopping the introduction of the first reactants 40 into the reactor 10.

Figure 3B:
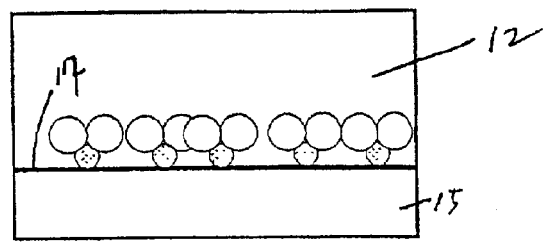

Preferably, as illustrated in FIG. 2, during the dilution of the non-chemically adsorbed portion of the first reactants 40, the reactor pressure is increased from the first predetermined pressure P1 to a second predetermined pressure P2 and thus the second predetermined pressure P2 is greater than the first predetermined pressure P1. Preferably, the second predetermined pressure P2 is greater than approximately 1.5 times the first predetermined pressure P1. These steps allow the non-chemically adsorbed portion of the first reactants 40 in the reactor 10 to be diluted in a very short period of time, for example, a few seconds, thus drastically reducing the overall purging time and purging efficiency during a purging step 32 compared to conventional ALD techniques. This dilution process significantly reduces the partial pressure of the non-chemically adsorbed portion of the first reactants 40 in the ALD reactor 10. Thus, only a very small amount of the non-chemically adsorbed portion of the first reactants 40 remain in the reactor 10 after the removal of the non-chemically adsorbed portion of the first reactants 40 as the reactant 40 is already diluted, thus maximizing purging efficiency. Also, because the first reactants 40 are diluted, intermixing between the first reactants 40 can be sufficiently prevented Then, as illustrated in FIG. 3B, the diluted non-chemically adsorbed portion of the first reactants 40 is removed (evacuated) from the single reaction space 12 before introducing second reactants 42 (dosing step 35) to form a desired ALD thin film 44 of FIG. 3D by chemical exchange. Preferably, removal of non-chemically adsorbed portion of the first reactants 40 is performed by pumping the reactor 10 using the pump 23, thereby lowering the pressure of the reactor 10 to a third predetermined pressure P3 (See FIG. 2). The third predetermined pressure P3 is lower than the first predetermined pressure P1 of the dosing step 31. Preferably, the third predetermined pressure P3 is lower than approximately 0.5 times the first predetermined pressure P1.

During this step, the decrease of the pressure to the third predetermined pressure P3 can be accomplished by stopping or reducing the introduction of the inert gas and opening the control valve 21. That is, conductance of the exhaustion line is increased.

Figure 3C:
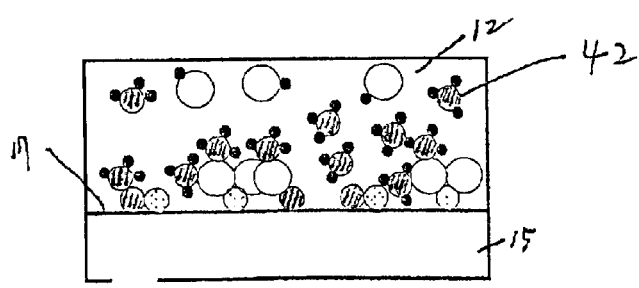

Now referring to FIG. 3C, the second reactants 42 are introduced into the reaction space 12, and thus a portion of the second reactants 42 is chemisorbed on the processing surfaces 17 of the batch 14 of the substrates 15 to effect chemical exchange. Of course, the diluting step 37 is preferably performed after the dosing 35 of the second reactants 42.

Figure 3D:
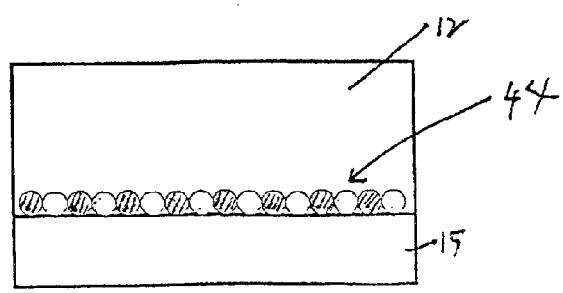

Turning to FIG. 3D, a non-chemically adsorbed portion of the second reactants 42 is removed (removing step 38 of FIG. 2) from the reaction space 12 using the same method as described above that is applied to the first reactants 40 during the removing step 34.

The above steps of introduction of the first and second reactants 40, 42 and removal of non-chemisorbed portions of the reactants 40, 42 from the reaction space 12 can be repeated to achieve a desired film thickness.

It is to be noted that the purging method suggested by the present invention is not dependent on the kind of the reactant, and thus can be utilized for formation of various ALD thin films. Such ALD thin films are, for example, an oxide layer of $Al_2O_3$, $TiO_2$, $ZrO_2$, $HfO_2$, $Ta_2O_5$, $Nb_2O_5$, $CeO_2$, $Y_2O_3$, $SiO_2$, $In_2O_3$, $RuO_2$, or $IrO_2$. The other examples are as follows: a composite oxide layer of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $(Ba,Sr)RuO_3$, Sn doped $In_2O_3$ (ITO), Fe doped $In_2O_3$, or Zr doped $In_2O_3$: a nitride layer of SiN, NbN, ZrN, TiN, TaN, $Ya_3N_5$, AlN, GaN, WN, or BN: a complex nitride layer of WBN, WSiN, TiSiN, TaSiN, or AlTiN: a metal layer of Si, Al, Cu, Ti, Ta, Mo, Pt, Ru, Rh, Ir, W, or Ag: a silicide layer of Al, W, Ti, or Co: and a metal silicate material $(M_{1-x}Si_xO_2)$. Here, the metal "M" can be hafnium (Hf), zirconium (Zr), tantalum (Ta), titanium (Ti), Cesium (Cs) or aluminum (Al). Those of skill in the art will appreciate that lists are not exhaustive or exclusive and are not intended to limit in any way the scope of the invention as claimed.

EXAMPLE 1

Figure 4:
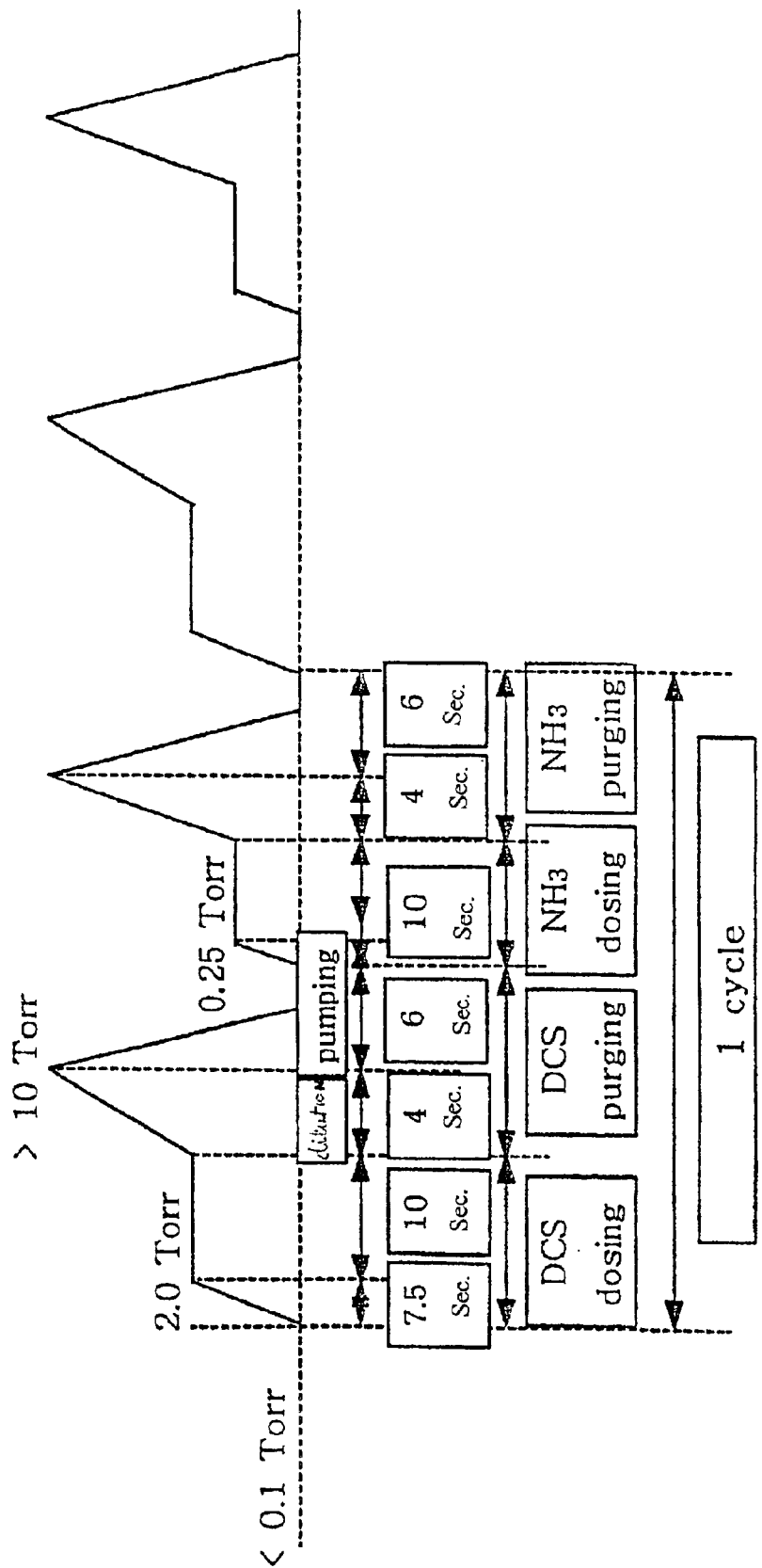
FIG. 4 is a graph illustrating process conditions in accordance with one embodiment of the present invention.
Figure 5:
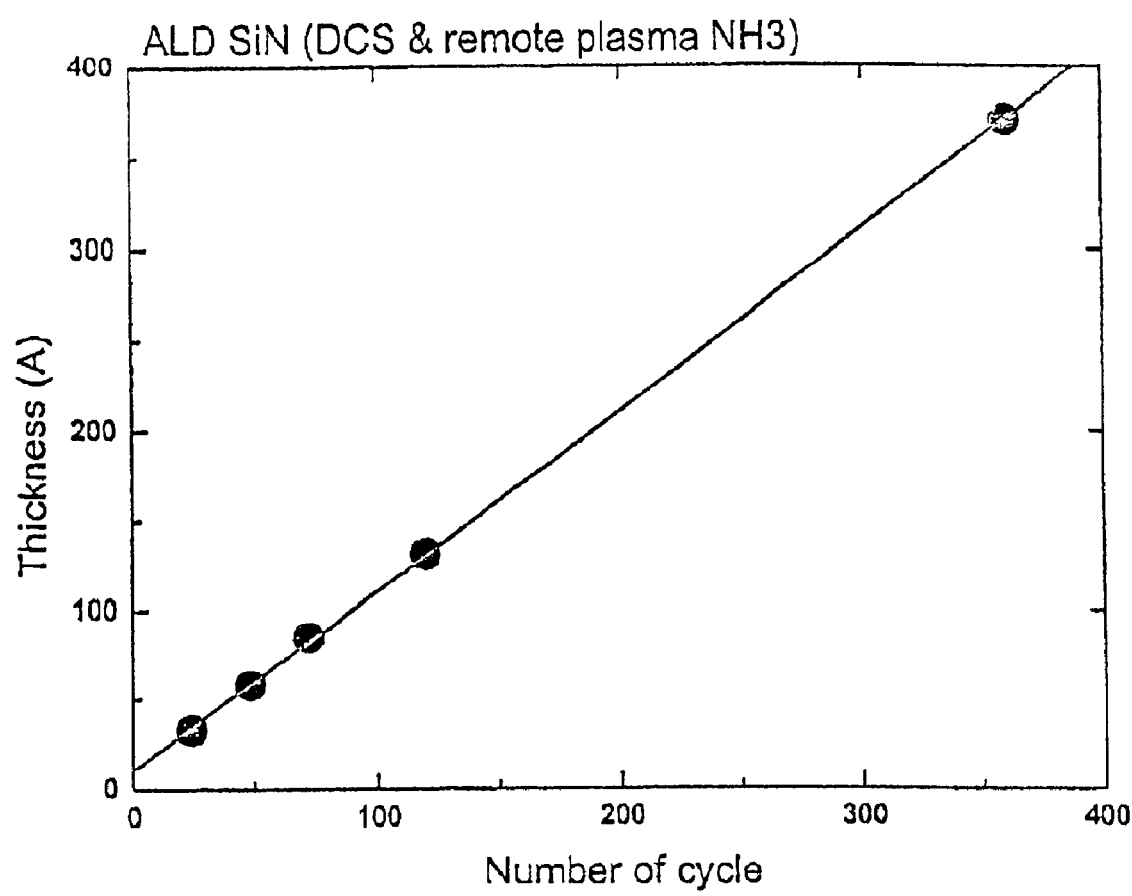
FIG. 5 is a graph illustrating the result of the ALD process performed in accordance with one embodiment of the present invention.

A SiN film is deposited by the present invention ALD process. The reactants used are DCS ($SiCl_2H_2$) and $NH_3$ gases activated by a remote plasma (400 W). The deposition temperature is 375° C. Flow rates of the reactants are 500 sccm for DCS and 2000 sccm for $NH_3$. For dilution before removal of non-chemically adsorbed reactants, 5000 sccm of $N_2$ gas is introduced into a reactor. The time and pressure for each step of DCS supplying, DCS purging, $NH_3$ supplying and $NH_3$ purging is shown in table 1 and is further illustrated in FIG. 4. Also, FIG. 5 illustrates the results of the above ALD process.

TABLE 1

| Item | DCS dosing | DCS purging | | NH3 dosing | NH3 purging | |
|---|---|---|---|---|---|---|
| | | Diluting | Removing | | Diluting | Removing |
| Pressure (Torr) | <0.1 → 2.0 | 2.0 | 2.0 → >10 | >10 → <0.1 | <0.1 → 0.25 | 0.25 | 0.25 → >10 | >10 → <0.1 |
| Time (sec) | 7.5 | 10 | 4 | 6 | 1.5 | 10 | 4 | 6 |

The growth rate in accordance with the ALD process described above is 1 Å/cycle, and a good ALD processing characteristic can be obtained.

Further, it has been observed that, without using the purging method of the present invention, the following problems could occur. First, if the purging step is performed with an inert gas such as Ar or $N_2$, under the same pressure as the pressure during the dosing step of the reactants, a substantial amount of the inert gas can remain in the reactor. This reduces the partial pressure of the reactants. Accordingly, the reactant dosing time for the next dosing step can be increased. In addition, the purging time is also increased. Second, if the purging is performed by pumping only without dilution before the pumping as in the one embodiment of the present invention, the purging takes significantly a long time.

EXAMPLE 2

HCD ($Si_2Cl_6$) is stored in a bubbler at room temperature and is introduced to a reactor with 500 sccm of $N_2$ gas as a carrier gas. Then, a purging is performed by diluting non-chemically adsorbed reactants with 5000 sccm of $N_2$ gas and then pumping (removing) away the non-chemically adsorbed reactants from the reactor. Next, 2000 sccm of remote plasma (400 W) $NH_3$ is supplied and the purging is done by diluting non-chemically adsorbed reactants with 5000 sccm of $N_2$ gas and then pumping (removing) away the non-chemically adsorbed reactants from the reactor.

Figure 6:
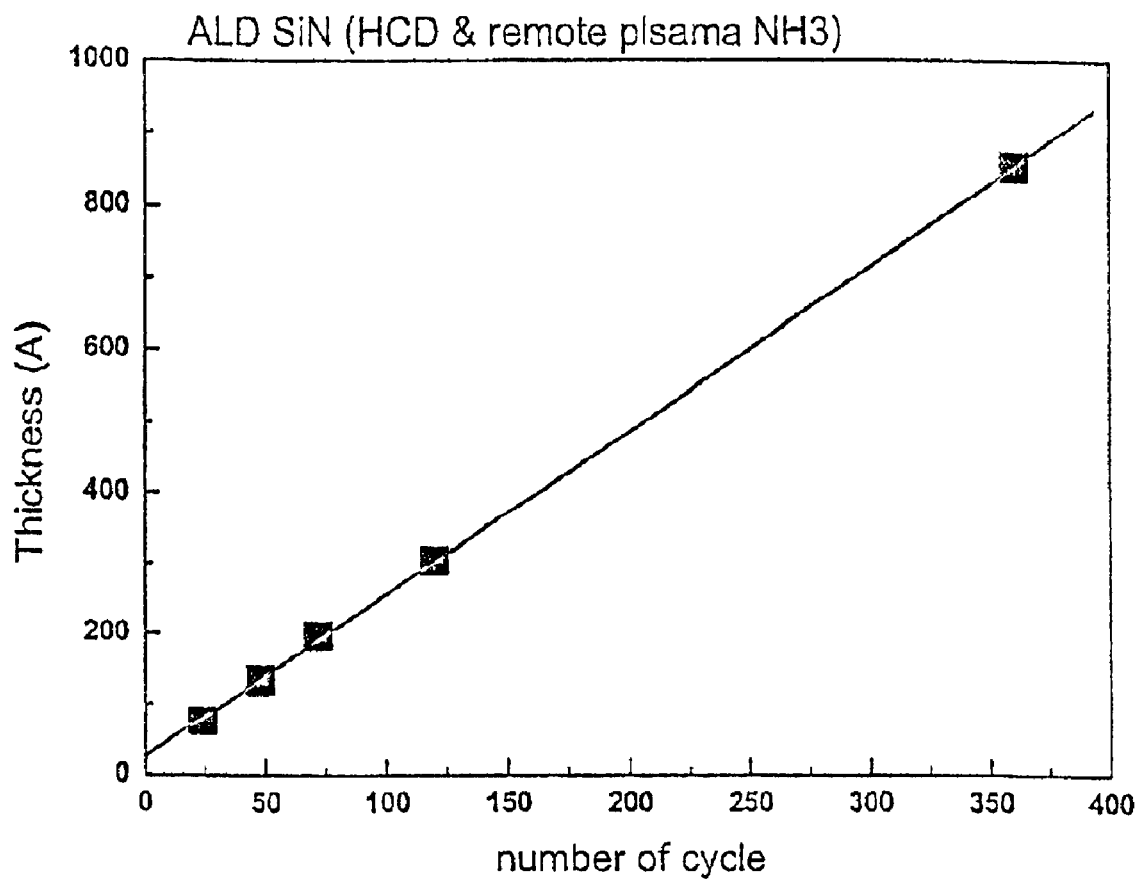
FIG. 6 is a graph illustrating the result of the ALD process performed in accordance with one embodiment of the present invention.

At this time, HCD is supplied to the reactor for 20 seconds. The reactor pressure is changed from 0.1 torr to 2 torr and then kept at 2 torr. The pressure during the purging was changed from 2 torr to 10 torr during the dilution step (4 seconds) and then, lowered to 0.1 torr during the pumping (6 seconds). The Supplying of $NH_3$ (30 seconds) and purging (4+6 seconds) was implemented by the same manner as described above. FIG. 6 illustrates the results of the above ALD process.

The growth rate was 2.3 Å/cycle and a good ALD processing characteristic can be obtained.

Some of the characteristics of the present invention described above are as follows:

1. The reactor pressure during the dosing step and that during the purging step can be different.

2. The reactor pressure for each dosing step for different reactants can be substantially the same or different.

3. The purging step may be seen to include a diluting step where the reactor pressure increases from the pressure during the dosing step of the reactants, and a removing or evacuation step of which pressure decreases to a lower pressure than the pressure during the dosing step of the reactants.

By utilizing these characteristics, the following effect can be obtained.

1. The dosing step of each reactant is dependent of partial pressure and time (reactant exposure dependency as illustrated by Langmuire). Accordingly, by increasing the partial pressure of the supplied reactant during the reactant dosing, the processing time can be reduced.

2. Differently from the conventional ALD process where a constant pressure should be kept, the dosing step of each reactant is accomplished after the purging by the pumping. Therefore, a desired pressure can be obtained from the lower pressure.

3. When the purging is implemented within a reactor having a large volume, an inert gas is firstly applied to dilute the reactants. Then, the pumping is implemented to obtain the desired degree of the purging effect within a short period of time.

In conclusion, the present invention offers many advantages over the conventional ALD techniques and overcomes many drawbacks of the conventional ALD techniques. For example, the present invention significantly increases the throughput of the ALD process. In particular, according to preferred embodiments of the present invention, because the furnace-type ALD reactor of the present invention has a large-volume single reaction space without being partitioned, it can receive and process more than 100 substrates all at once, substantially more than any other conventional ALD techniques. Also, because all of the product wafers for one ALD process can be placed in a single reaction space, not distributed among several reaction spaces in a reactor, the loading/unloading of the batch of substrates can be automatically and quickly done by an automatic wafer transport mechanism. Further, non-chemically adsorbed reactants are diluted in a single reaction space before removal of non-chemically adsorbed reactants from the reaction space, the purging time can be significantly reduced and purging efficiency is maximized.

Besides these advantages, the present invention ALD reactor is less costly than conventional ALD reactors and is easier to maintain. Thus, the present invention ALD process increases throughput and manufacturability to the extent that mass production is possible with ALD.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a thin film using atomic layer deposition (ALD), comprising:

providing a reactor having a single reaction space;

concurrently loading a batch of substrates into the single reaction space of the reactor;

introducing a gas containing reactants into the single reaction space, and chemically adsorbing a portion of the reactants on top surfaces of the substrates within the single reaction space;

diluting non-chemically adsorbed reactants in the single reaction space; and removing non-chemically adsorbed reactants from the single reaction space, wherein said introducing the gas containing reactants is performed at a first pressure and said diluting is performed to a second pressure, and wherein the second pressure is greater than the first pressure.

2. The method of claim 1, wherein the first pressure is between approximately 0.1 Torr and approximately 0.5 Torr.

3. The method of claim 1, wherein said second pressure is greater than approximately 1.5 times the first pressure.

4. The method of claim 1, wherein said removing comprises pumping the reactor, thereby lowering the pressure of the reactor to a third pressure, and wherein the third pressure is lower than the first pressure.

5. The method of claim 4, wherein the third pressure is lower than approximately 0.5 times the first pressure.

6. The method of claim 1, wherein said loading comprises transferring the batch of substrates using an automatic wafer transport mechanism.

7. A method of forming a thin film using atomic layer deposition (ALD), comprising:

providing a semiconductor substrate into a reactor;

introducing a gas containing reactants into the reactor at a first pressure, and chemically adsorbing a portion of the reactants on the substrate surface;

diluting non-chemically adsorbed reactants in the reactor such that the pressure of the reactor is increased to a second pressure; and removing the diluted non-chemically adsorbed reactants from the reactor.

8. The method of claim 7, wherein the first pressure is between approximately 0.1 Torr and approximately 0.5 Torr.

9. The method of claim 7, wherein said second pressure is greater than approximately 1.5 times the first pressure.

10. The method of claim 7, wherein said removing is performed by pumping the reactor, thereby lowering the pressure of the reactor to a third pressure, wherein the third pressure is lower than the first pressure.

11. The method of claim 10, wherein the third pressure is lower than approximately 0.5 times the first pressure.

12. The method of claim 7, wherein the reactor includes a pressure control valve connected to an exhaustion line for removing the diluted non-chemically adsorbed reactants and, wherein said diluting comprises substantially closing the control valve and supplying an inert gas into the reactor while substantially stopping the introduction of the gas containing reactants into the reactor.

13. The method of claim 7, wherein the reactor includes a pressure control valve connected to an exhaustion line and, wherein said diluting comprises supplying an inert gas with an amount substantially more than the amount of the gaseous reactants introduced into the reactor while stopping the introduction of the gaseous reactants into the reactor.

14. A method of forming a thin film using ALD, comprising:

providing a plurality of wafers into a single reactor;

introducing gaseous reactants into the single reactor at a first pressure, and chemically adsorbing a portion of the reactants on top surfaces of the plurality of substrates;

diluting non-chemically adsorbed reactants in the single reactor to a second pressure; and removing the diluted non-chemically adsorbed reactants from the single reactor, wherein said second pressure is greater than the first pressure.

15. The method of claim 14, wherein the reactor includes a pressure control valve connected to an exhaustion line and, wherein said diluting comprises substantially closing the control valve and supplying an inert gas into the reactor while stopping the introduction of the gaseous reactants into the reactor.

16. The method of claim 14, wherein the reactor includes a pressure control valve connected to an exhaustion line and, wherein said diluting comprises supplying an inert gas with an amount substantially more than the amount of the gaseous reactants into the reactor while stopping the introduction of the gaseous reactants into the reactor.

17. The method of claim 14, wherein the first pressure is between approximately 0.1 Torr and approximately 0.5 Torr.

[

18. The method of claim 14, wherein said second pressure is greater than approximately 1.5 times the first pressure.

19. The method of claim 14, wherein said removing is performed by pumping the chamber, thereby lowering the pressure of the reactor to a third pressure, wherein the third pressure is lower than the first pressure.

20. The method of claim 19, wherein the third pressure is lower than approximately 0.5 times the first pressure.

21. The method of claim 14, wherein the reactor is a furnace-type reactor and, wherein substantially all the top surfaces of the substrates face the same direction for automated wafer transfer.

22. The method of claim 14, wherein the number of the plurality of substrates is more than one hundred.

23. The method of claim 14, wherein the reactor has a single reaction space for atomic layer deposition such that all of the substrates are placed within the single reaction space.

24. An atomic layer deposition (ALD) method of forming a thin film layer, comprising:

a) inserting one or more semiconductor substrates into a chamber;

b) introducing a first gaseous reactant into a reactor at a first pressure, and chemically adsorbing a portion of the reactants on the surfaces of the one or more substrates;

c) diluting non-chemically adsorbed first reactants in the reactor by injecting an inert gas into the chamber to increase the pressure of the reactor than the first pressure;

d) removing the non-chemically adsorbed first reactants from the chamber;

e) introducing a second gaseous reactant into the reactor at a second pressure to form a single atomic layer by chemical exchange;

f) diluting non-chemically adsorbed reactants in the reactor such that the pressure of the reactor is increased; and g) removing the non-chemically adsorbed reactants from the chamber.

25. The method of claim 24, wherein the first pressure is substantially the same as the second pressure.

26. The method of claim 24, wherein the first pressure is different from the second pressure.

27. The method of claim 24, wherein, during said first and second diluting, the reactor pressure is increased to not less than approximately 1.5 times the first and second pressure, respectively.

28. The method of claim 24, wherein said removing is performed by pumping the chamber to a third pressure substantially lower than either first or second pressure.

29. The method of claim 24, wherein the single atomic layer is an oxide layer of $Al_2O_3$, $TiO_2$, $ZrO_2$, $HfO_2$, $Ta_2O_5$, $Nb_2O_5$, $CeO_2$, $Y_2O_3$, $SiO_2$, $In_2O_3$, $RuO_2$, or $IrO_2$.

30. The method of claim 24, wherein the single atomic layer is a composite oxide layer of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $(Ba,Sr)RuO_3$, Sn doped $In_2O_3$ (ITO), Fe doped $In_2O_3$, or Zr doped $In_2O_3$.

31. The method of claim 24, wherein the single atomic layer is a nitride layer of SiN, NbN, ZrN, TiN, TaN, $Ya_3N_5$, AlN, GaN, WN, or BN.

32. The method of claim 24, wherein the single atomic layer is a complex nitride layer of WBN, WSiN, TiSiN, TaSiN, or AlTiN.

33. The method of claim 24, wherein the single atomic layer is a metal layer of Si, Al, Cu, Ti, Ta, Mo, Pt, Ru, Rh, Ir, W, or Ag.

34. The method of claim 24, wherein the single atomic layer is a silicide layer of Al, W, Ti, or Co.

35. The method of claim 24, wherein the single atomic layer is a metal silicate material ($M_{1-x}Si_xO_2$), the metal "M" being selected from the group consisting of hafnium (Hf), zirconium (Zr), tantalum (Ta), titanium (Ti), Cesium (Cs) and aluminum (Al).

36. The method of claim 24, further comprising the step of repeating at least one of steps (b)–(g).

37. A method of forming a thin film, comprising:

(a) providing a reactor having a single reaction space;

(b) concurrently loading the plurality of wafers having a processing surface into the reaction space, wherein the processing surfaces of the wafers face in substantially the same direction;

(c) introducing a first reactant into the reaction space, wherein a portion of the first reactant is chemically adsorbed on the processing surface of each of the plurality of wafers;

(d) diluting a non-chemically adsorbed portion of the first reactant in the single reaction space, wherein said introducing the first reactant is performed at a first pressure and said diluting the non-chemically adsorbed portion of the first reactant is performed to a second pressure, and wherein the second pressure is greater than the first pressure;

(e) removing the non-chemically adsorbed portion of the first reactant from the reaction space;

(f) introducing a second reactant into the reaction space, wherein a portion of the second reactant is chemically adsorbed on the processing surface of each of the plurality of wafers;

(g) diluting a non-chemically adsorbed portion of the second reactant in the single reaction space; and (h) removing the non-chemically adsorbed portion of the second reactant from the reaction space.

38. The method of claim 37, further comprising repeating at least one of steps (c)–(h).

39. The method of claim 1, wherein the single reaction space is not partitioned.

40. The method of claim 38, wherein said introducing the second reactant is performed at a third pressure and said diluting the non-chemically adsorbed portion of the second reactant is performed to a fourth pressure, and wherein the fourth pressure is greater than the third pressure.

* * * * *